United States Patent [19]
Hiroyama et al.

[11] Patent Number: 5,963,572
[45] Date of Patent: Oct. 5, 1999

[54] SEMICONDUCTOR LASER DEVICE AND MANUFACTURING METHOD THEREOF

[75] Inventors: Ryoji Hiroyama; Takahiro Uetani, both of Hirakata; Kiyoshi Oota, Neyagawa; Koji Komeda, Takatsuki; Masayuki Shono; Akira Ibaraki, both of Hirakata; Keiichi Yodoshi, Kawachinagano, all of Japan

[73] Assignee: Sanyo Electric Co., Ltd., Moriguchi, Japan

[21] Appl. No.: 08/773,346

[22] Filed: Dec. 26, 1996

[30] Foreign Application Priority Data

Dec. 28, 1995 [JP] Japan .................................. 7-343411
Mar. 25, 1996 [JP] Japan .................................. 8-068393
Mar. 25, 1996 [JP] Japan .................................. 8-068394

[51] Int. Cl.$^6$ ...................................................... H01S 3/19
[52] U.S. Cl. .............................................. 372/46; 372/45
[58] Field of Search ........................... 372/45, 46; 438/22

[56] References Cited

U.S. PATENT DOCUMENTS

| | | | |
|---|---|---|---|
| 5,446,753 | 8/1995 | Yoshida | 372/46 |
| 5,528,617 | 6/1996 | Kobayashi et al. | 372/46 |
| 5,608,751 | 3/1997 | Shimoyama et al. | 372/45 |
| 5,608,752 | 3/1997 | Goto et al. | 372/45 |

FOREIGN PATENT DOCUMENTS 8-18160  1/1996  Japan .

OTHER PUBLICATIONS

Neamen, Semiconductor Physics and Devices: Basic Principles, Boston: Irwin, 1992, pp. 138–143.
The Japan Society of Applied Physics and Related Societies, (The 50th Autumn Meeting, 1989), p. 893, Sept. 27, 1989, Extended Abstracts.
The Japan Society of Applied Physics and Related Societies, (The 56th Autumn Meeting, 1995), p. 902, Aug. 26, 1995, Extended Abstracts.
The Japan Society of Applied Physics and Related Societies, (The 43rd. Spring Meeting, 1996), p. 1024, Mar. 26, 1996, Extended Abstracts.
14th IEEE International Semiconductor Laser Conference Digest Th3.5, 1994, pp. 243–244, (No month available).
IEEE Journal of Selected Topics in Quantum Electronics, vol. 1, No. 2, Jun. 1995, pp. 723–727.
Jpn J. Appl. Phys. vol. 34 (1995) pp. 3533–3542, Part 1, No. 7A, Jul. 1995.
Cleo'96, Technical Digest CThP6, pp. 458, 461, Jun. 6, 1996.

*Primary Examiner*—Rodney Bovernick
*Assistant Examiner*—Quyen Phan Leung
*Attorney, Agent, or Firm*—Armstrong, Westerman, Hattori, McLeland & Naughton

[57] ABSTRACT

A semiconductor laser device including an n-type cladding layer, an active layer, a p-type cladding layer having a ridge portion, an n-type optical confinement layer formed on the flat portion and side surfaces of the ridge portion of the p-type cladding layer, and an n-type current blocking layer formed on the n-type optical confinement layer in this order. The optical confinement layer is composed of a low resistivity layer doped with n-type impurity, which has a smaller refractive index than the p-type cladding layer and a bandgap energy greater than the energy of lasing light. The optical confinement layer has an impurity concentration of $5\times10^7\text{cm}^{-3}$ or less. The n-type current blocking layer has a thickness of 0.4 $\mu$m or less.

8 Claims, 7 Drawing Sheets

FIG. 8

SEMICONDUCTOR LASER DEVICE AND MANUFACTURING METHOD THEREOF

CROSS-REFERENCE TO RELATED APPLICATION

This application is related to application Ser. No. 08/430,497, filed Apr. 28, 1995, now U.S. Pat. No. 5,608,752 commonly assigned with the present invention.

BACKGROUND OF THE INVENTION

1. Field of the Invention

The present invention relates to semiconductor laser devices and more particularly, to a semiconductor laser device having a stripe-like current path and a manufacturing method thereof.

2. Description of the Background Art

Conventionally, AlGaInP semiconductor laser devices have been intensively studied and developed as semiconductor laser devices having lasing wavelength in the red band. The AlGaInP semiconductor laser devices are capable of lasing light in the band of 630 to 680 nm. Since this wavelength band has high visual sensitivity, such semiconductor laser devices are used as laser pointers, line markers, etc. Furthermore, they are expected to be used as light sources in high density recording systems, etc., because of their shorter lasing wavelength as compared with AlGaAs semiconductor laser devices.

Such semiconductor laser devices generally use a GaAs layer as a current blocking layer. IEEE JOURNAL OF SELECTED TOPICS IN QUANTUM ELECTRONICS, VOL.1, NO.2, JUNE 1995, pp.723–727 shows an example of a ridge-type semiconductor laser device which adopts a double-layer structure including an AlInP layer (an optical confinement layer) and a GaAs layer as a current blocking layer.

This reference discloses that the semiconductor laser device having the current blocking layer of double-layer structure improves a lasing threshold current and slope efficiency (the slope of current versus light output power characteristic in a lasing state) as compared with common semiconductor laser devices having a current blocking layer of a single-layer structure of a GaAs layer.

In the process of manufacturing such a ridge-type semiconductor laser device, generally, a stripe-like mask film of a dielectric material, such as an $SiO_2$ film, is formed in the center on a semiconductor layer formed on a semiconductor substrate and the semiconductor layer is etched through the mask film to form a ridge. Then with the mask film left, a current blocking layer is formed on the flat areas on both sides of the ridge and side surfaces of the ridge by vapor-phase growth such as metal organic chemical vapor deposition (MOCVD)

However, when growing a current blocking layer formed of a material with a high Al composition ratio such as an AlInP layer without introducing corrosive gas such as HCl, which is undesirable for the manufacturing device, the high Al composition ratio material is formed like dots on the mask film of dielectric material even if growth conditions are selected. Consequently, when a current blocking layer composed of a GaAs layer is grown next, the GaAs layer, which usually does not grow on a dielectric material, is formed in a large area on the mask film with the high Al composition ratio material formed like dots as cores. It is then difficult to remove the mask film by wet etching or dry etching using reactive gas after the formation of the current blocking layer. As a result, part of the mask film remains in the finished semiconductor laser device, thus introducing the problem of low yield of devices.

On the other hand, further improvement of lasing threshold current and slope efficiency are generally required for semiconductor devices, not only for the AlGaInP semiconductor laser devices.

Particularly, the AlGaInP semiconductor laser devices have inferior characteristics of lasing threshold current and slope efficiency due to problems inherent in the material as compared with AlGaAs semiconductor laser devices and therefore there is a demand for further improvement of the characteristics.

SUMMARY OF THE INVENTION

An object of the present invention is to provide a semiconductor laser device having good characteristics of lasing threshold current and slope efficiency and a method of manufacturing the same.

Another object of the present invention is to provide a semiconductor laser device with an optical confinement layer, which is capable of production with high yield without using corrosive gas and a method of manufacturing the same.

A semiconductor laser device according to the present invention includes a cladding layer of a first conductivity type, an active layer, a cladding layer of a second conductivity type opposite to the first conductivity type, and a low resistivity layer (optical confinement layer) doped with impurity of the first conductivity type, having a stripe-like opening part with a certain width and having a smaller refractive index than the second conductivity type cladding layer and a bandgap energy higher than energy of lasing light (hv: h is the Planck's constant and v is the number of vibration of lasing light), in this order, wherein the low resistivity layer has an impurity concentration of $5 \times 10^{17} cm^{-3}$ or less at least in the region on the active layer side in the thickness direction.

This semiconductor laser device provides preferable current blocking effect by a pn junction between the low resistivity layer and the second conductivity type cladding layer, resulting in good characteristics of lasing threshold current and slope efficiency.

It is preferred that the impurity concentration of the low resistivity layer is not less than $5 \times 10^{16} cm^{-3}$. In this case, the entirety of the low resistivity layer or at least its region on the active layer side can serve as a low resistivity region which can have a sufficient carrier concentration and therefore the pn junction between the low resistivity region and the second conductivity type cladding layer provides sufficient current blocking effect. This provides more excellent characteristics of lasing threshold current and slope efficiency.

It is more preferred that the impurity concentration of the low resistivity layer is not less than $7 \times 10^{16} cm^{-3}$. In this case, the entirety of the low resistivity layer or at least its region on the active layer side can serve as a low resistivity region which can have a more sufficient carrier concentration and therefore the pn junction between the low resistivity region and the second conductivity type cladding layer provides more sufficient current blocking effect. This provides more excellent characteristics of lasing threshold current and slope efficiency.

It is preferred that the impurity concentration of the low resistivity layer is not more than $3 \times 10^{17} cm^{-3}$. In this case, characteristics of lasing threshold current and slope efficiency are improved. It is more preferred that the impurity concentration of the low resistivity layer is not more than $2\times10^{17}\text{cm}^{-3}$. In this case, the characteristics of lasing threshold current and slope efficiency more improved.

The low resistivity layer may have an impurity concentration of $5\times10^{17}\text{cm}^{-3}$ or lower in the entire region in the thickness direction. In this case, it is preferred that the low resistivity layer has an impurity concentration of $5\times10^{16}\text{cm}^{-3}$ or higher in the entire region in the thickness direction. This allows the entirety of the low resistivity layer to have a sufficient carrier concentration and hence pn junction between the low resistivity layer and the second conductivity type cladding layer provides more sufficient current blocking effect. This results in more excellent characteristics of lasing threshold current and slope efficiency.

The second conductivity type cladding layer may include a flat portion formed on the active layer and a stripe-like ridge portion formed on the flat portion and the low resistivity layer may be formed on the upper surface of the flat portion and side surfaces of the ridge portion. In this case, the ridge portion exists in the stripe-like opening.

The first conductivity type cladding layer may include $(Al_{x1}Ga_{1-x1})_{y1}In_{1-y1}P$, the second conductivity type cladding layer may include $(Al_{x2}Ga_{1-x2})_{y2}In_{1-y2}P$, and the low resistivity layer may include $(Al_{x3}Ga_{1-x3})_{y3}In_{1-y3}P$, where $1\geq x3>x1>0$, $1\geq x3>x2>0$, $1>y1>0$, $1>y2>0$, and $1>y3>0$. In particular, it is preferable that $1\geq x3\geq 0.9$, $0.7\geq x1\geq 0.5$, and $0.7\geq x2\geq 0.5$. It is preferable that a first conductivity type GaAs substrate is used as the substrate and the first conductivity type cladding layer, the second conductivity type cladding layer and the low resistivity layer respectively include $(Al_{x3}Ga_{1-x3})_{0.5}In_{0.5}P$ $(Al_{x2}Ga_{1-x2})_{0.5}In_{0.5}P$, and $(Al_{x3}Ga_{1-x3})_{0.5}In_{0.5}P$ which are approximately lattice-matched to the GaAs substrate.

In this case, it is preferable that the flat portion has a thickness of not less than 0.01 $\mu$m and not more than 0.13 $\mu$m. Then the difference (real refractive index difference) between the real refractive index to the active layer in the region under the ridge portion and that in the region under the portion out of the ridge portion is $3\times10^{-3}$ or greater and such inconvenience is avoided that the active layer is exposed to the air when manufacturing. It is preferable that the thickness of the flat portion is not less than 0.03 $\mu$m and not more than 0.08 $\mu$m. Then the real refractive index difference is $5\times10^{-3}$ or greater and exposure of the active layer to the air is sufficiently prevented when manufacturing.

When the low resistivity layer is composed of $(Al_{x3}Ga_{1-x3})_{y3}In_{1-y3}P$, it is the most preferable that the Al composition ratio x3 is 1 because three-element-containing compound semiconductor has higher thermal conductivity than four-element-containing compound semiconductor. This maximizes the real refractive index difference.

In this case, a single-quantum well structure layer or a multi-quantum well structure layer composed of AlGaInP or GaInP may be used as the active layer, or a single layer including a non-quantum well layer composed of AlGaInP or GaInP may be used.

The semiconductor laser device may further include a current blocking layer of the first conductivity type formed on the low resistivity layer and having a greater thermal conductivity than the low resistivity layer.

In this case, while the low resistivity layer composed of $(Al_{x3}Ga_{1-x3})_{y3}In_{1-y3}P$, for example, has inferior thermal conductivity and is likely to deteriorate lasing threshold current and slope efficiency, it is possible to reduce the thickness of the low resistivity layer to lessen reduction of heat radiating effect and supplement the heat radiating effect with the current blocking layer while securing sufficient current blocking effect.

The semiconductor laser device may further include a current blocking layer of the first conductivity type having a greater impurity concentration (or a carrier concentration) than the low resistivity layer.

In this case, while the current blocking effect, the function of the low resistivity layer as a current blocking layer, may be small because the low resistivity layer has a small impurity concentration (carrier concentration), the current blocking layer with a large impurity concentration (carrier concentration) sufficiently compensates for the current blocking effect.

It is preferred that the first conductivity type current blocking layer has a bandgap energy less than the energy of lasing light.

The current blocking layer may have a greater thickness than the low resistivity layer functioning as a current blocking layer to increase the current blocking effect.

The low resistivity layer preferably has a thickness of not less than 0.3 $\mu$m and not more than 1 $\mu$m, more preferably not less than 0.4 $\mu$m and not more than 0.85 $\mu$m, and still more preferably, not less than 0.5 $\mu$m and not more than 0.75 $\mu$m.

This provides good heat radiating characteristic while suppressing optical absorption by the first conductivity type current blocking layer. This results in a reduction of lasing threshold current.

Particularly, the current blocking layer may include GaAs. This is preferable because GaAs is advantageous in manufacturing because it is free from oxidation and has thermal conductivity superior to that of AlGaInP, AlInP, etc.

The semiconductor laser device may further include an etching stopping layer provided on the flat portion and between the flat portion and the ridge portion. In this case, the flat portion can be precisely formed, which increases the manufacturing yield of semiconductor laser devices having good characteristics of lasing threshold current and slope efficiency.

It is preferred that the low resistivity layer has a carrier concentration of approximately $5\times10^6\text{cm}^{-3}$ or greater at least in the region on the active layer side in the thickness direction. In this case, at least the region on the active layer side in the low resistivity layer serves as a low resistivity region and pn junction between the low resistivity region and the second conductivity type cladding layer provides sufficient current blocking effect. This improves characteristics of lasing threshold current and slope efficiency.

It is more preferable that the carrier concentration of the low resistivity layer at least in the region on the active layer side in the thickness direction is approximately $7\times10^{16}\text{cm}^{-3}$ or greater. This further improves characteristics of lasing threshold current and slope efficiency.

The low resistivity layer may have a carrier concentration of approximately $5\times10^{16}\text{cm}^{-3}$ or greater in the entire region in the thickness direction. In this case, the entirety of the low resistivity layer serves as a low resistivity region and pn junction between the low resistivity region and the second conductivity type cladding layer provides sufficient current blocking effect. This further improves the characteristics of lasing threshold current and slope efficiency.

Preferably, the carrier concentration in the entire region in the thickness direction of the low resistivity layer is approximately $7 \times 10^{16} \text{cm}^{-3}$ or greater. This further improves the characteristics of lasing threshold current and slope efficiency.

The above-mentioned layers are preferably formed by vapor-phase growth such as MOCVD, MBE, etc.

The present invention is also applicable to various kinds of semiconductor laser devices with a low resistivity layer (current blocking layer) having a stripe-like opening, as well as semiconductor laser devices having a stripe-like ridge portion, and it is applicable to self-alignment type semiconductor laser devices, for example.

A semiconductor laser device according to another aspect of the present invention includes a cladding layer of a first conductivity type, an active layer, a cladding layer of a second conductivity type opposite to the first conductivity type and having a stripe-like ridge portion serving as a current path, an optical confinement layer containing Al, formed on the second conductivity type cladding layer to cover side surfaces of the ridge portion and having a smaller refractive index than the second conductivity type cladding layer and a bandgap energy larger than the energy of lasing light (hv), and a current blocking layer of the first conductivity type formed on the optical confinement layer and serving as an oxidation inhibitor layer, in this order, wherein the first conductivity type current blocking layer has a thickness of 0.4 μm or less.

In the process of manufacturing this semiconductor laser device, when the optical confinement layer is formed by vapor-phase growth through a mask film composed of a dielectric material for formation of the ridge portion and then the current blocking layer is formed, the current blocking layer does not cover a large area on the mask film even if the material of the optical confinement layer is formed like dots on the mask film. This is due to the fact that the thickness of the current blocking layer is not more than 0.4 μm. Hence, it is possible to easily remove the mask film by usual wet etching or dry etching using reactive gas. This enhances manufacturing yield without using corrosive gas.

Particularly, the thickness of the current blocking layer is preferably not less than 0.2 μm over the entire region on the optical confinement layer. Then the current blocking layer prevents oxidation of the optical confinement layer in manufacturing process to enable good vapor-phase growth on the optical confinement layer and the current blocking layer also provides sufficient current blocking effect.

The first conductivity type cladding layer may include $(Al_{x1}Ga_{1-x1})_{y1}In_{1-y1}P$, the second conductivity type cladding layer may include $(Al_{x2}Ga_{1-x2})_{y2}In_{1-y2}P$, and the optical confinement layer may include $(Al_{x3}Ga_{1-x3})_{y3}In_{1-y3}P$, where $1 \geq x3 > x1 > 0$, $1 \geq x3 > x2 > 0$, $1 > y1 > 0$, $1 > y2 > 0$, and $1 > y3 > 0$. Particularly, more preferably, $1 \geq x3 \geq 0.9$, $0.7 \geq x1 \geq 0.5$, and $0.7 \geq x2 \geq 0.5$. It is more preferable that a first conductivity type GaAs substrate is used as the substrate and the first conductivity type cladding layer, the second conductivity type cladding layer and the optical confinement layer include $(Al_{x1}Ga_{1-x1})_{0.5}In_{0.5}P$, $(Al_{x2}Ga_{1-x2})_{0.5}In_{0.5}P$, and $(Al_{x3}Ga_{1-x3})_{0.5}In_{0.5}P$ which are approximately lattice-matched to the GaAs substrate.

In this case, the thickness of the flat portion is preferably not less than 0.01 μm and not greater than 0.13 μm, and greater preferably not less than 0.03 μm and not greater than 0.08 μm. Preferably, the thickness of the optical confinement layer is not less than 0.3 μm and not greater than 1 μm, more preferably not less than 0.4 μm and not more than 0.85 μm, and still more preferably not less than 0.5 μm and not greater than 0.75 μm. When the optical confinement layer is composed of $(Al_{x3}Ga_{1-x3})_{y3}In_{1-y3}P$, it is the most preferable that the Al composition ratio x3 is 1, for three-element-containing compound semiconductor has thermal conductivity superior than that of four-element-containing compound semiconductor. This maximizes the refractive index.

In this case, a single-quantum well structure layer or a multi-quantum well structure layer composed of AlGaInP or GaInP may be used as the active layer, or a single layer including a non-quantum well layer composed of AlGaInP or GaInP may be used.

It is preferred that the current blocking layer has a larger impurity concentration (or a carrier concentration) than the optical confinement layer.

In this case, while the current blocking effect, the function of the optical confinement layer as a current blocking layer, may be lessened because the impurity concentration (carrier concentration) of the optical confinement layer is small, the current blocking layer having a large impurity concentration (carrier concentration) sufficiently compensates for the current blocking effect.

Particularly, the current blocking layer may be composed of GaAs. This is preferable because GaAs, which is free from oxidation, is advantageous in manufacturing and has superior thermal conductivity as compared to AlGaInP, AlInP, etc.

It is preferred that the optical confinement layer is of the first conductivity type and has an impurity concentration of $5 \times 10^{17} \text{cm}^{-3}$ or less at least in the region on the active layer side in the thickness direction. This improves characteristics of lasing threshold current and slope efficiency.

It is more preferable that the impurity concentration of the optical confinement layer is not greater than $3 \times 10^{17} \text{cm}^{-3}$. This further improves the characteristics of lasing threshold current and slope efficiency.

It is still more preferable that the impurity concentration of the optical confinement layer is not more than $2 \times 10^{17} \text{cm}^{-3}$. This still further improves the characteristics of lasing threshold current and slope efficiency.

The optical confinement layer may have an impurity concentration of $5 \times 10^{17} \text{cm}^{-3}$ or less in the entire region in the thickness direction. This further improves the characteristics of lasing threshold current and slope efficiency.

The optical confinement layer may be a low resistivity layer doped with impurity of the first conductivity type. In this case, the current blocking effect by the pn junction between the low resistivity layer and the second conductivity type cladding layer is desirably obtained and hence characteristics of lasing threshold current and slope efficiency are improved.

The optical confinement layer preferably has an impurity concentration of approximately $5 \times 10^{16} \text{cm}^{-3}$ or greater at least in the region on the active layer side in the thickness direction. In this case, the entirety of the optical confinement layer or at least its region on the active layer side can serve as a low resistivity region which can have a sufficient carrier concentration and therefore pn junction between the low resistivity region and the second conductivity type cladding layer provides sufficient current blocking effect. This provides more excellent characteristics of lasing threshold current and slope efficiency.

It is more preferable that the impurity concentration of the optical confinement layer is not less than $7 \times 10^{16} \text{cm}^{-3}$. In this case, the entirety of the optical confinement layer or at least its region on the active layer side can serve as a low resistivity region which can have a more sufficient carrier concentration and therefore pn junction between the low resistivity region and the second conductivity type cladding layer provides more sufficient current blocking effect. This provides still more excellent characteristics of lasing threshold current and slope efficiency.

The optical confinement layer may have an impurity concentration of $5 \times 10^{16} cm^{-3}$ or higher in the entire region in the thickness direction.

The optical confinement layer preferably has a carrier concentration of approximately $5 \times 10^6 cm^{-3}$ or greater at least in the region on the active layer side in the thickness direction, and more preferably, not less than $7 \times 10^{16} cm^{-3}$.

A method of manufacturing a semiconductor laser device according to another aspect of the present invention includes the steps of growing a first conductivity type cladding layer, an active layer and a second conductivity type cladding layer in this order on a semiconductor substrate, forming a mask film including a dielectric material on the second conductivity type cladding layer and then etching the second conductivity type cladding layer through the mask film to form a ridge portion, forming an optical confinement layer containing Al, having a smaller refractive index than the second conductivity type cladding layer and a bandgap energy larger than energy of lasing light by vapor-phase growth on the second conductivity type cladding layer having the ridge portion through the mask film, forming a first conductivity type current blocking layer having a thickness of 0.4 am or smaller as an oxidation inhibitor layer by vapor-phase growth on the optical confinement layer, and removing the mask film by etching.

The conditions for vapor-phase growth of the optical confinement layer are set such that the material of the optical confinement layer is discretely formed like dots on the mask film, or preferably, so that it is almost not formed at all. The process of growing the first conductivity type cladding layer, the active layer and the second conductivity type cladding layer on the semiconductor substrate is usually accomplished by vapor-phase growth.

In this manufacturing method, when the optical confinement layer is formed through the mask film composed of a dielectric material and then the current blocking layer is formed, the current blocking layer does not cover a large area of the mask film even if the material of the optical confinement layer is formed like dots on the mask film due to the fact that the material of the optical confinement layer contains Al, for the thickness of the current blocking layer is not more than 0.4 µm. Hence, it is possible to easily remove the mask film by usual wet etching or dry etching using reactive gas. This enhances manufacturing yield without using corrosive gas.

The mask film is a silicon oxide film or a silicon nitride film, for example, and MOCVD, MBE (Molecular Bean Epitaxy) or the like is used as the vapor-phase growth, for example.

In AlGaAs semiconductor laser devices, Al composition ratios of the first and second conductivity type cladding layers are preferably selected in the range of 0.4 to 0.6 and the Al composition ratio of the optical confinement layer is selected to be greater than the Al composition ratios of these cladding layers, preferably in the range of 0.42 to 0.62.

Thus, when the first and second conductivity type cladding layers contain Al, the Al composition ratio of the optical confinement layer is selected to be greater than those of these cladding layers, and the optical confinement layer having the Al composition ratio thus selected to be greater than those of the cladding layers grows like dots on the mask film.

Another layer such as an etching stopping layer may be included in the second conductivity type cladding layer. The current blocking layer preferably has a bandgap energy less than energy of lasing light.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
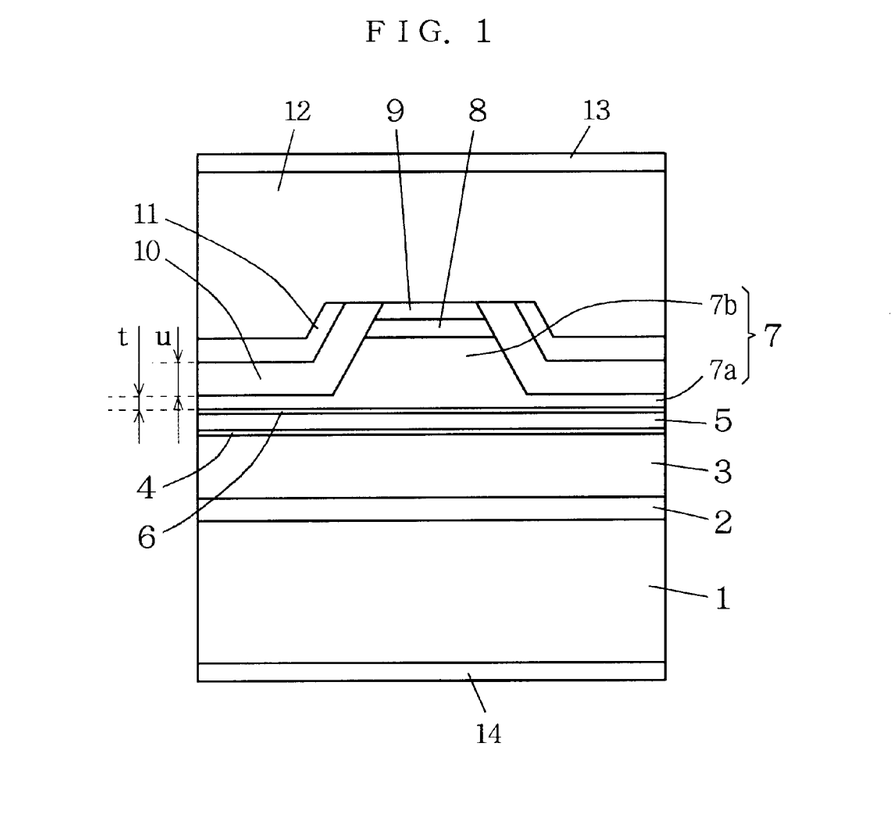
FIG. 1 is a schematic cross-sectional view of a semiconductor laser device according to a preferred exemplary embodiment of the present invention.

An embodiment of the present invention will be described in detail referring to the drawings. FIG. 1 is a schematic cross-sectional view of an AlGaInP semiconductor laser device according to a preferred exemplary embodiment of the present invention and FIG. 2 is a schematic band structure diagram of the active layer and the current blocking layer, and their vicinity in the semiconductor laser device of FIG. 1.

In FIG. 1, an n-type GaAs semiconductor substrate 1 has its one main surface (a crystal growth surface) inclined at an angle θ from (100) plane toward the [011] direction (the angle is called an off angle θ, hereinafter.) The off angle θ shall be between 5 and 17°, and preferably between 7 and 13°. A 0.3-µm thick n-type $Ga_{0.5}In_{0.5}P$ buffer layer 2 is formed on the one main surface of the GaAs semiconductor substrate 1.

On the n-type buffer layer 2, a 1.2µm thick Si-doped n-type $(Al_{x1}Ga_{1-x1})_{0.5}In_{0.5}P$ cladding layer 3 is formed. In this embodiment, x1 is equal to 0.7.

Figure 2:
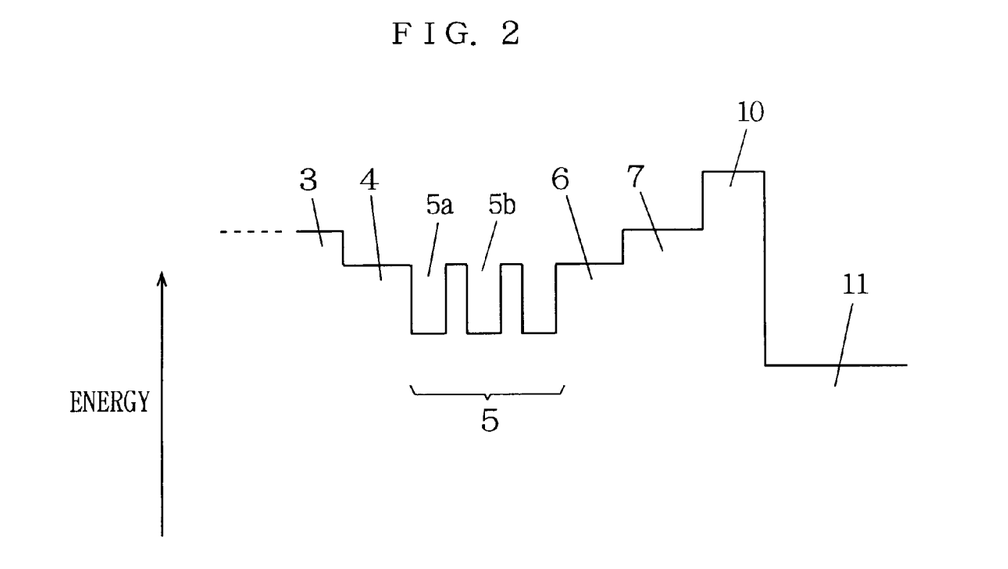
FIG. 2 is a schematic band structure diagram of the active layer, the current blocking layer and their neighborhood in the semiconductor laser device of FIG. 1.

As shown in detail in FIG. 2, a 500Å thick undoped $(Al_{z1}Ga_{1-z1})_{0.5}In_{0.5}P$ optical guiding layer 4 is formed on the n-type cladding layer 3. In this embodiment, z1 is equal to 0.5.

On the optical guiding layer 4, an undoped active layer 5 of strain compensation type multi-quantum well structure is formed, which includes an alternate lamination of a 100-Å thick tensile-strained $(Al_pGa_{1-p})_qIn_{1-q}P$ quantum well layer 5a and a 40-Å thick compressive-strained $(Al_rGa_{1-r})_sIn_{1-s}P$ quantum barrier layer 5b. Here, $1>p\geq 0$ and $1>q>0.51$, and in this embodiment, p=0 and q=0.65. Furthermore, $1\geq r\geq 0$ and $0<s<0.51$, and in this embodiment, r=0.5 and s=0.45.

A 500-Å thick undoped $(Al_{z2}Ga_{1-z2})_{0.5}In_{0.5}P$ optical guiding layer 6 is formed on the active layer 5. In this embodiment, z2 is equal to 0.5.

On the optical guiding layer 6, a Zn-doped p-type $(Al_{x2}Ga_{1-x2})_{0.5}In_{0.5}P$ cladding layer 7 is formed. In this embodiment, x2 is equal to 0.7. The cladding layer 7 is composed of a flat portion 7a having a thickness t and a stripe-like ridge portion 7b extending in the cavity length direction (the direction perpendicular to the paper) approximately in the center of the flat portion. The stripe-like ridge portion 7b has a height of 0.5 to 0.8 μm, a top width of 2.5 to 3.5 μm and a bottom width of 3.5 to 4.5 μm.

On the upper surface of the ridge portion 7b, a 0.1-μm thick Zn-doped p-type $Ga_{0.5}In_{0.5}P$ cap layer 8 and a 0.3-μm thick Zn-doped p-type GaAs cap layer 9 are formed in this order.

On the sides of these p-type cap layers 8 and 9 and the ridge portion 7b and on the flat portion 7a, an Se-doped n-type $(Al_{x3}Ga_{1-x3})_{0.5}In_{0.5}P$ optical confinement layer (low resistivity layer) 10 having a thickness u and an Se-doped n-type GaAs current blocking layer 11 are formed in this order. Here, $1\geq x3>x1>0$ and $1\geq x3>x2>0$, and in this embodiment, x3=1.

The optical confinement layer 10 has its impurity concentration equal to or less than $5\times 10^7 cm^{-3}$. The optical confinement layer 10 has an optical confinement function and it also functions as a current blocking layer.

The current blocking layer 11 serves as an oxidation inhibitor layer. This current blocking layer 11 has higher thermal conductivity and larger impurity concentration than the optical confinement layer 10. In this embodiment, the impurity concentration of the current blocking layer 11 is The current blocking layer 11 has a thickness of 0.4 μm or smaller, and it is 0.3 μm in this embodiment. To prevent oxidation of the optical confinement layer 10 when manufacturing and to obtain sufficient current blocking effect, the thickness of the current blocking layer 11 is preferably not less than 0.2 μm.

On the cap layer 9 and the current blocking layer 11, a 5-μm thick Zn-doped p-type GaAs contact layer 12 is formed.

A p-side ohmic electrode 13 composed of Au—Cr is formed on the upper surface of the contact layer 12 and an n-side ohmic electrode 14 composed of Au—Sn—Cr is formed on the lower surface of the n-type GaAs semiconductor substrate 1.

This semiconductor laser device has the active layer 5 interposed between the cladding layers 3 and 7 having a bandgap energy greater than the bandgap energy of the active layer 5 (the energy of lasing light (hv)), the optical confinement layer 10 having a bandgap energy greater than the energy (hv) of the lasing light (that is, almost no absorption of lasing light) and having a refractive index smaller than that of the cladding layer 7, and the current blocking layer 11 having thermal conductivity superior to that of the optical confinement layer 10.

When this optical confinement layer 10 is of the same conductivity type as the cladding layer 7 or is undoped, the current blocking effect and the current narrowing effect by pn junction are lessened, resulting in deterioration of lasing threshold current and slope efficiency. Accordingly, it is preferred that the optical confinement layer 10 has conductivity type opposite that of the cladding layer 7.

The semiconductor laser device of this embodiment operates as a real index guided laser device with the structure of the optical confinement layer 10 transparent to the lasing light. To operate as a real index guided laser device, a semiconductor laser device requires that the difference (real refractive index difference) between the real refractive index to the active layer 5 under the ridge portion 7b and the real refractive index to the active layer 5 under the region out of the ridge portion 7b is equal to or greater than a given value. Preferably, to operate satisfactory as a real index guided laser device, the laser device requires a real refractive index difference of $3\times 10^{-3}$ or larger.

Figure 3:
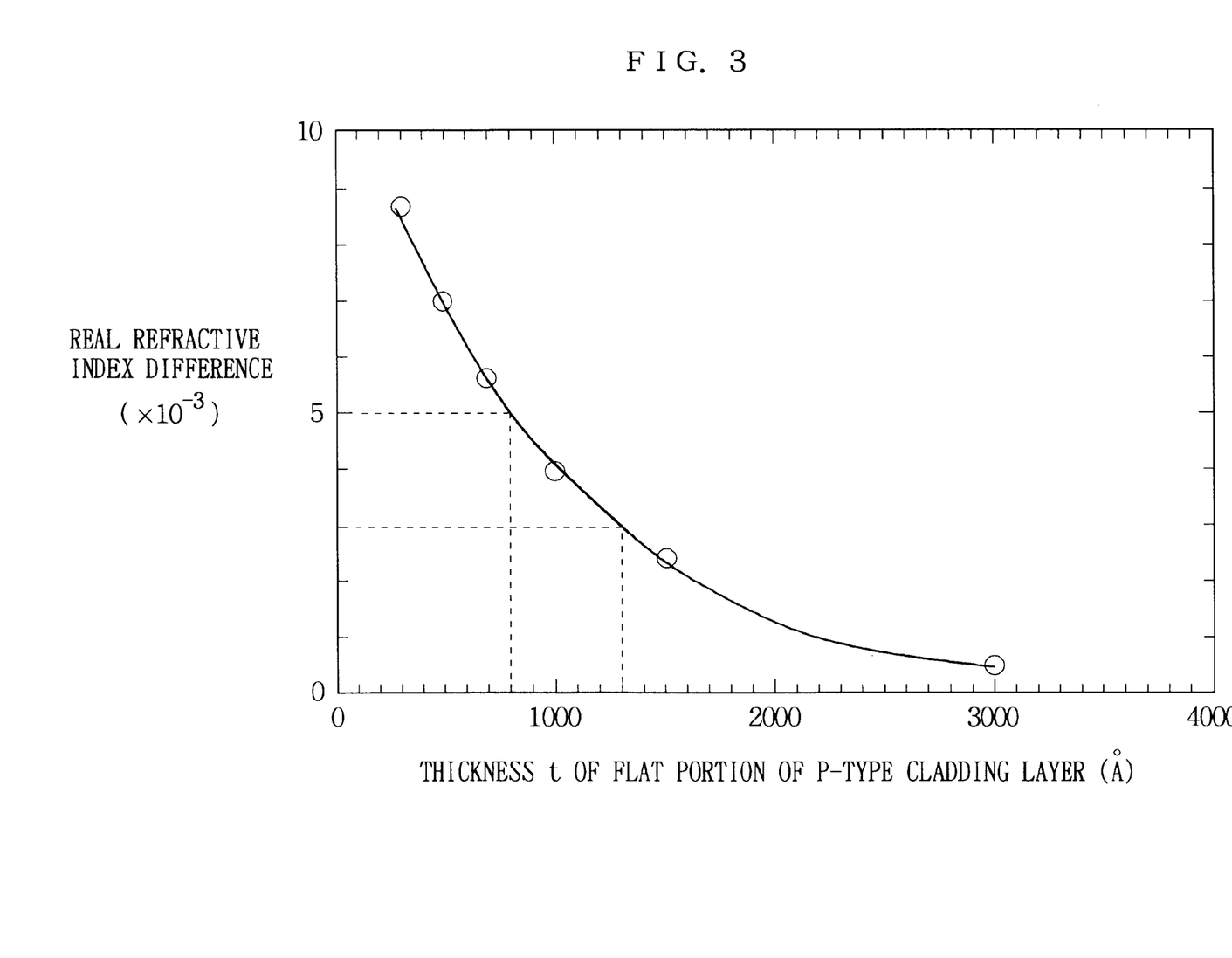
FIG. 3 is a diagram showing the relation between thickness t of the flat portion of the p-type cladding layer and real refractive index difference.

FIG. 3 shows the results of a calculation about the relation between thickness t of the flat portion 7a and the real refractive index difference to the active layer 5 between the region under the ridge portion 7b and the region under outside of the ridge portion 7b.

From the results shown in FIG. 3, in this embodiment, the thickness t of the flat portion 7a is selected to be not more than 1300 Å so that the real refractive index difference is not less than $3\times 10^{-3}$, and preferably, the thickness t is selected to be not greater than 800 Å so that the real refractive index difference is not less than $5\times 10^{-3}$. With a structure in which the optical confinement layer 10 is directly in contact with the active layer 5 or the optical guiding layer 6, the layers are exposed to the air when manufacturing. It is therefore desirable to set the lower limit of the thickness t of the flat portion 7a to about 100 Å, for example.

Figure 4:
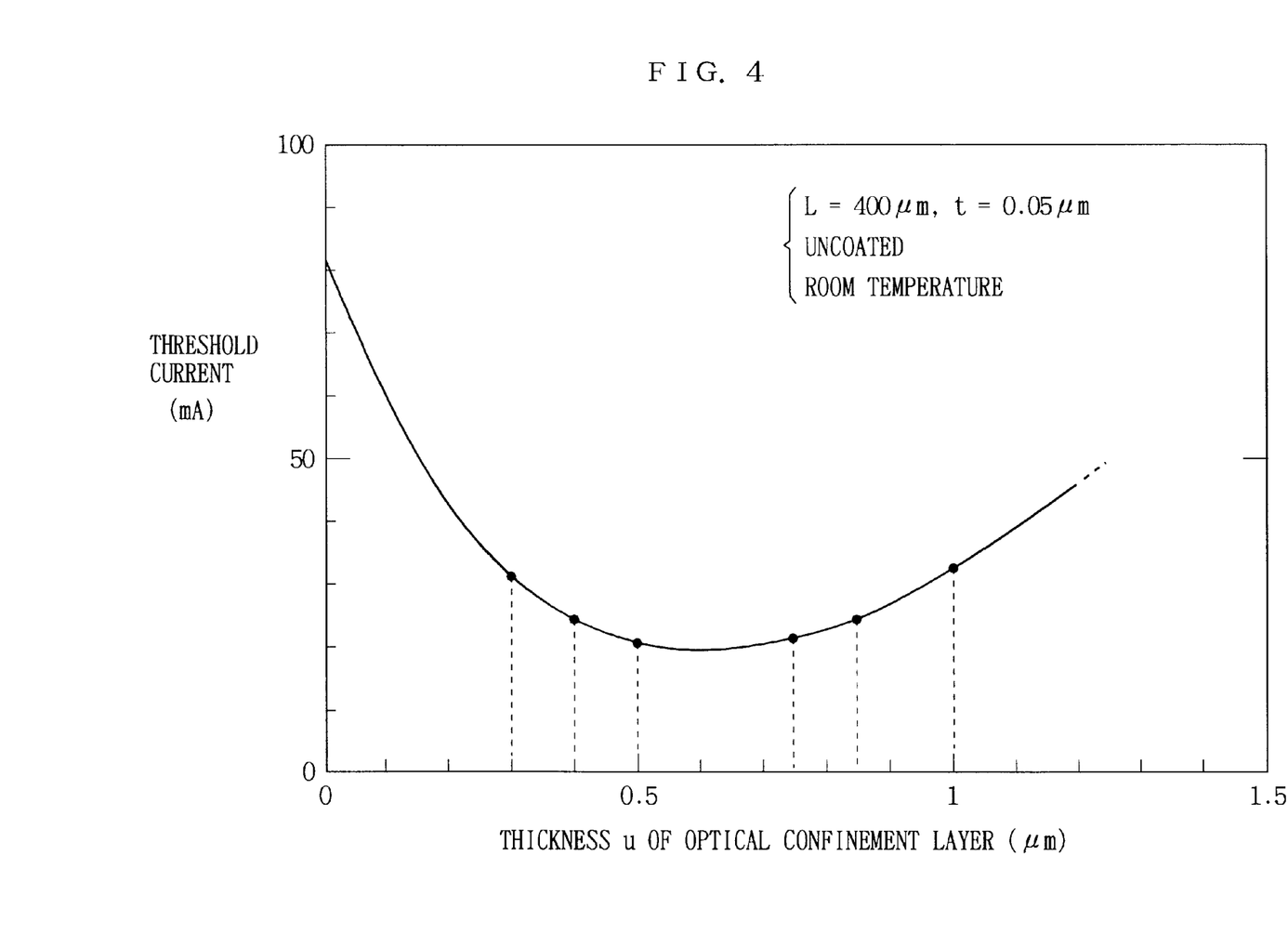
FIG. 4 is a diagram showing the relation between thickness u of the optical confinement layer and lasing threshold current.

FIG. 4 shows the relation, obtained by experiment, between a thickness u of the optical confinement layer 10 and lasing threshold current of the semiconductor laser device of the embodiment. The characteristics shown in FIG. 4 were obtained by causing the semiconductor laser device to continuously lase under the conditions of impurity concentration of the optical confinement layer 10 being $1\times 10^{17} cm^{-3}$, the cavity length L=400 μm, facets uncoated and at room temperature.

The results in FIG. 4 show that the thickness u of the optical confinement layer 10 is preferably not less than 0.3 μm and not greater than 1 μm, more preferably not less than 0.4 μm and not greater than 0.85 μm, and still more preferably not less than 0.5 μm and not greater than 0.75 μm.

The optical confinement layer 10 is required to have a certain thickness for the reason below. That is to say, in the semiconductor laser device of this embodiment, since the current blocking layer 11 is composed of a material capable of optical absorption, a small thickness of the optical confinement layer 10 allows the current blocking layer 11 to strongly absorb light. On the other hand, since the optical confinement layer 10 composed of AlGaInP has heat radiating property inferior to that of the GaAs layer, an excessively large thickness of the optical confinement layer 10 deteriorates heat radiating characteristic of the semiconductor laser device.

Figure 5:
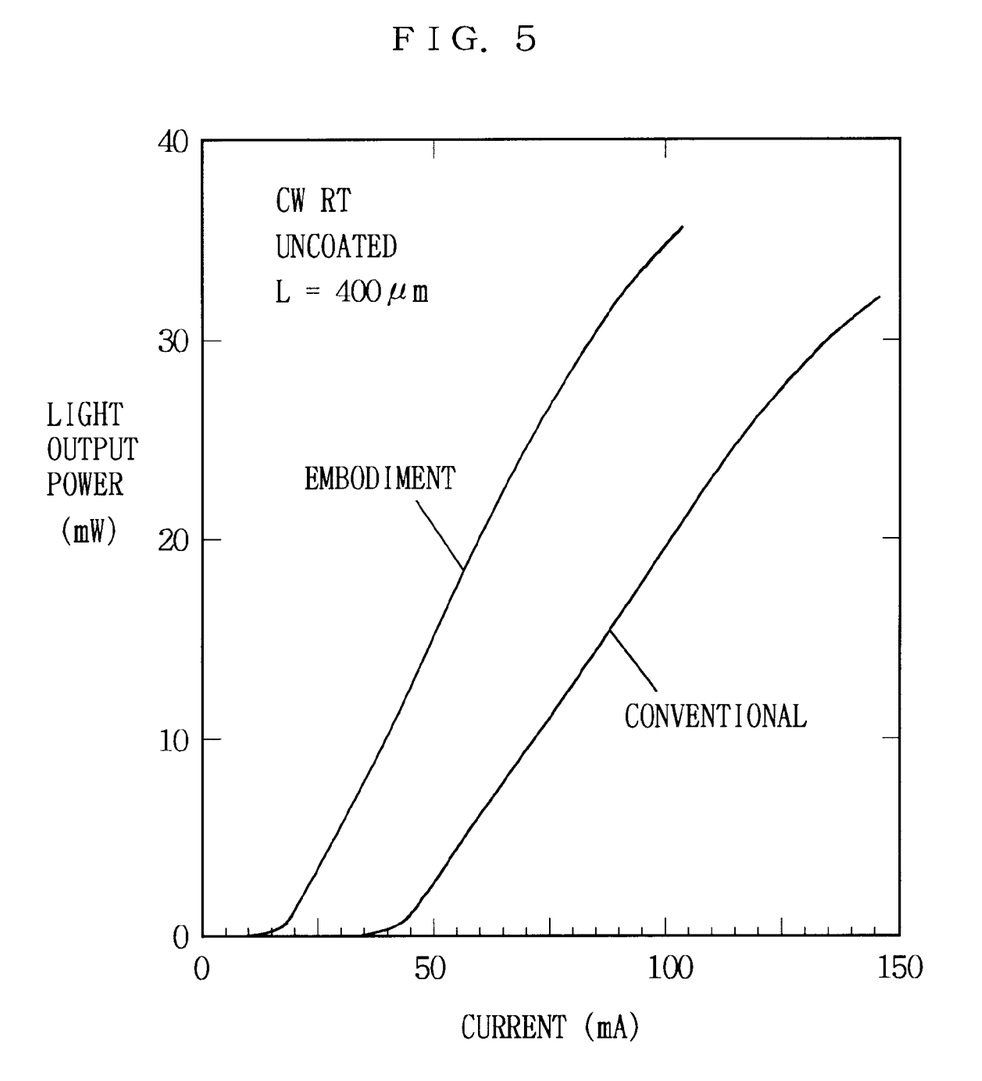
FIG. 5 is a diagram showing light output power-current characteristics of the semiconductor laser device of the preferred exemplary embodiment and a conventional one.

FIG. 5 provides a current versus light output power characteristic diagram (an I-L characteristic diagram) of the semiconductor laser device of this embodiment and a conventional loss-guide type AlGaInP semiconductor laser device having a current blocking layer of single-layer structure of a GaAs layer. The characteristics of FIG. 5 were obtained by causing the semiconductor laser devices to continuously lase under the conditions of impurity concentration of the optical confinement layer 10 being $1\times10^{17}$cm$^{-3}$, cavity length L=400 μm, thickness u of the optical confinement layer 10=0.5 μm, thickness t of the flat portion 7a=0.05 μm, facets uncoated and at room temperature.

The results in FIG. 5 show that the semiconductor laser device of this embodiment has smaller lasing threshold current and improved slope efficiency as compared with the conventional semiconductor laser device.

Figure 6:
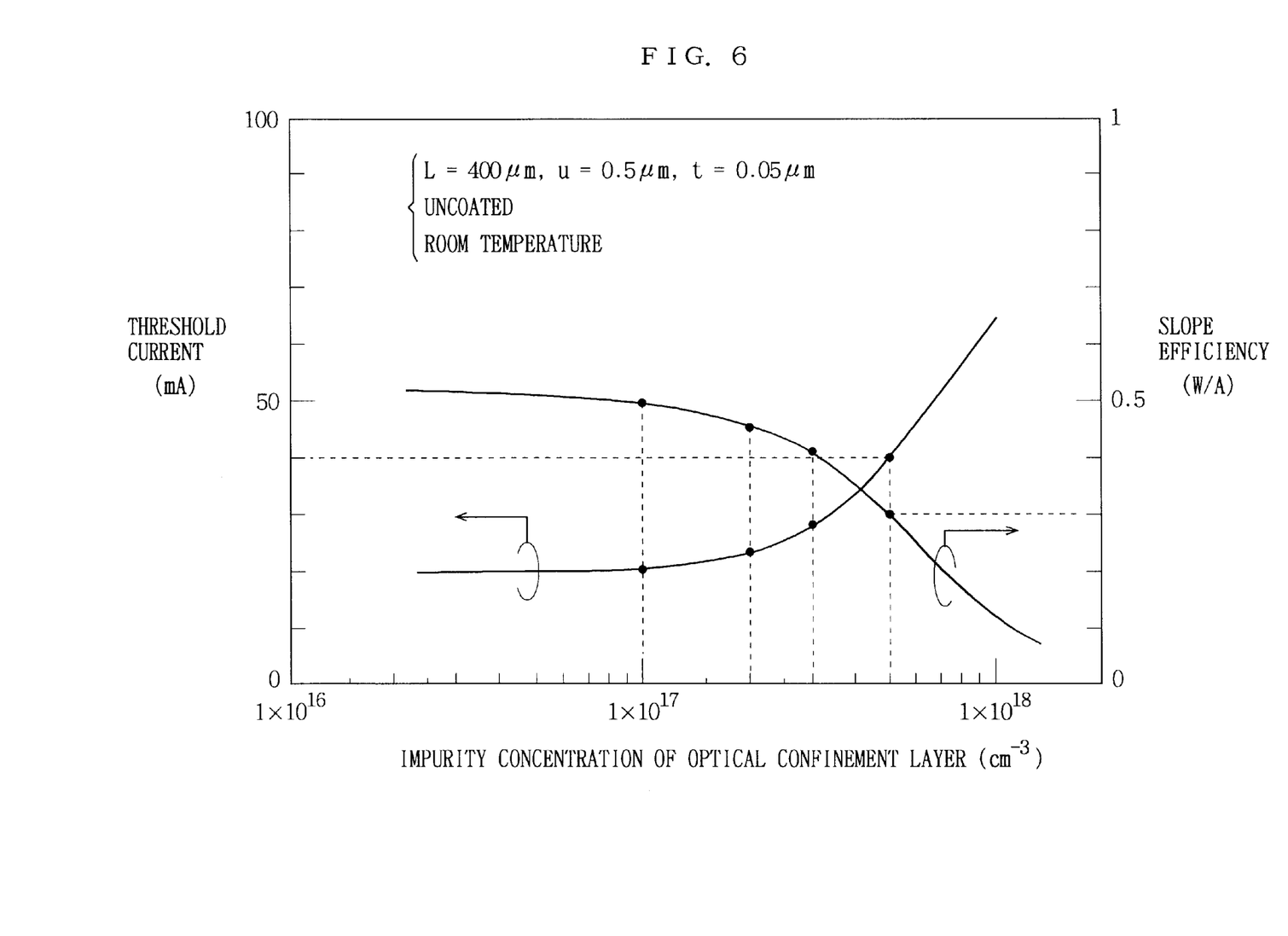
FIG. 6 is a diagram showing the relation between impurity concentration of the optical confinement layer and lasing threshold current and the relation between the impurity concentration of the optical confinement layer and slope efficiency.

FIG. 6 shows the relation between impurity concentration (dopant concentration) of the optical confinement layer 10 and lasing threshold current and the relation between impurity concentration of the optical confinement layer 10 and slope efficiency.

From FIG. 6, it is understood that the lasing threshold current becomes smaller and the slope efficiency becomes larger as the impurity concentration of the optical confinement layer 10 becomes smaller.

Particularly, when impurity concentration of the optical confinement layer 10 is equal to or smaller than $5\times10^{17}$cm$^{-3}$, the lasing threshold current can be equal to or less than 40 mA, which is less than that of the conventional loss-guide type AlGaInP semiconductor layer device having a current blocking layer of single-layer structure of a GaAs layer and the slope efficiency can be equal to or larger than 0.3 W/A, greater than that of the conventional semiconductor laser device.

More preferably, the impurity concentration of the optical confinement layer 10 is $3\times10^{17}$cm$^{-3}$ or less, in which case the lasing threshold current can be less than 30 mA and the slope efficiency can be greater than 0.4 W/A, and further preferably, its impurity concentration is $2\times10^{17}$cm$^{-3}$ or less, in which case the lasing threshold current can be less than 25 mA and the slope efficiency can be greater than 0.45 W/A. Further, most preferably, its impurity concentration is around $1\times10^{17}$cm$^{-3}$, in which case the lasing threshold current can be extremely small, the slope efficiency can be equal to or greater than 0.5 W/A and pn junction between the low resistivity region and the second conductivity type cladding layer provides sufficient current blocking effect.

It is thus seen that the lasing threshold current and the slope efficiency are improved more as the impurity concentration of the optical confinement layer 10 becomes smaller.

With conventional semiconductor laser devices, it has been thought that higher impurity concentration of a current blocking layer is desirable because current is blocked by a pn junction formed as the current blocking layer has an opposite conductivity type opposite that of the adjacent cladding layer. Accordingly, the phenomenon that the lasing threshold current and the slope efficiency are improved as the impurity concentration of the optical confinement layer 10 becomes lower in the semiconductor laser device of this invention is completely opposite to the phenomenon that higher impurity concentration of the current blocking layer is preferable in conventional semiconductor laser devices.

The reason for this phenomenon is not yet clear, but it is thought that this occurs because the impurity (dopant: Se in this embodiment) can easily move in the optical confinement layer 10 having a larger bandgap (a larger Al composition ratio) than the cladding layer 7 and the impurity (dopant) diffuses from the optical confinement layer 10 toward the active layer 5 in the semiconductor laser device of the invention. Also, it is considered to be one of the causes that the thickness t of the flat portion 7a of the semiconductor laser device of the invention is less than that in conventional semiconductor laser devices.

When the impurity concentration (carrier concentration) of this optical confinement layer 10 is too small, the current blocking effect and the current narrowing effect by pn junction of the optical confinement layer 10 and the cladding layer 7 are lessened and then the lasing threshold current and the slope efficiency are deteriorated. Accordingly, it is preferred that the impurity concentration of the optical confinement layer 10 is greater than $2\times10^{16}$cm$^{-3}$ and it is more preferred that it is equal to or greater than $5\times10^{6}$cm$^{-3}$.

In the above-described embodiment in which the ratio of activation of dopant is almost 100%, carrier concentration when the impurity concentration is $2\times10^{16}$cm$^{-3}$ approximately corresponds to $2\times10^{16}$cm$^{-3}$, carrier concentration when the impurity concentration is $5\times10^{16}$cm$^{-3}$ approximately corresponds to $5\times10^{16}$cm$^{-3}$, carrier concentration when the impurity concentration is $7\times10^{16}$cm$^{-3}$ approximately corresponds to $7\times10^{16}$cm$^{-3}$ and carrier concentration when the impurity concentration is $1\times10^{17}$cm$^{-3}$ approximately corresponds to $1\times10^{17}$cm$^{-3}$.

Next, an example of a method of manufacturing the semiconductor laser device of this embodiment will now be explained.

Figure 7A:
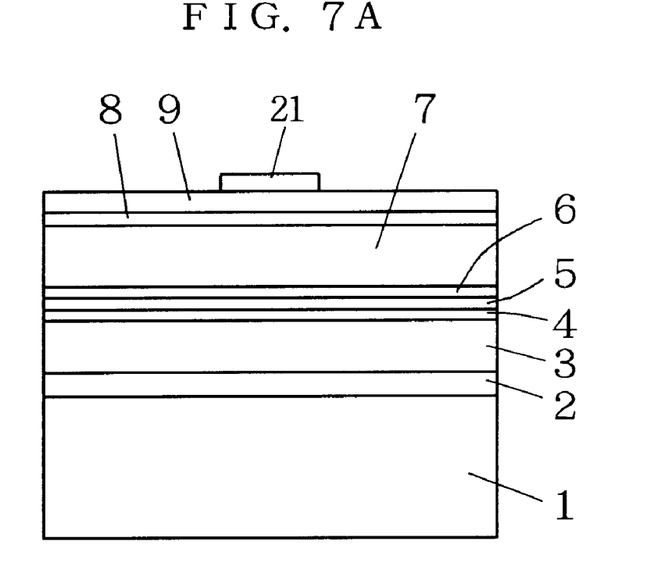
FIGS. 7A and FIG. 7B are schematic cross-sectional views showing process of manufacturing the semiconductor laser device of FIG. 1.

First, as shown in FIG. 7A, an n-type buffer layer 2, an n-type cladding layer 3, an optical guiding layer 4, an active layer 5, an optical guiding layer 6, a p-type cladding layer 7, a p-type GaInP cap layer 8 and a p-type GaAs cap layer 9 are continuously grown by MOCVD in this order on an n-type GaAs semiconductor substrate 1. Then, a 0.2-μm thick SiO$_2$ film is formed on the p-type GaAs cap layer 9 by a thin film forming method such as sputtering, CVD or electron beam evaporation, which is formed into a stripe-like mask film 21 by using hydrofluoric acid system etchant.

Figure 7B:
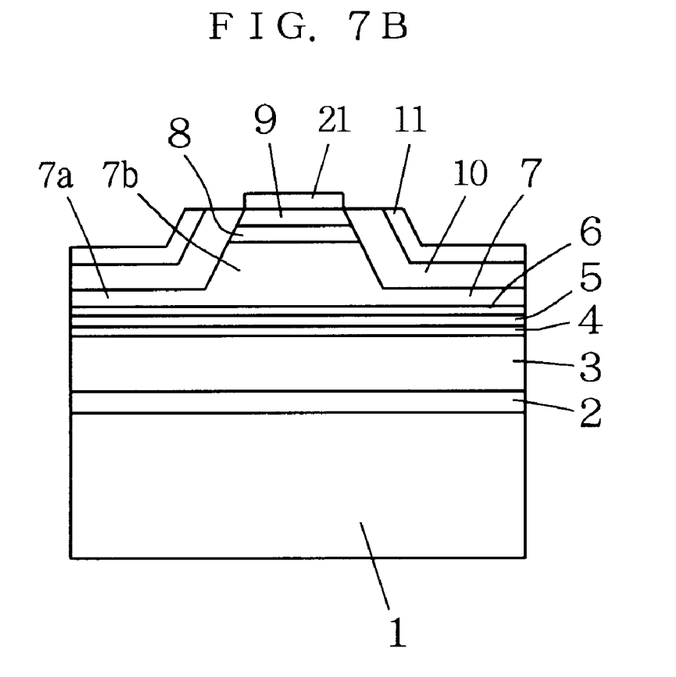

Next, as shown in FIG. 7B, the p-type cladding layer 7 is wet-etched through the mask film 21 to form the p-type cladding layer 7 into the form of the flat portion 7a and the ridge portion 7b. Then the n-type optical confinement layer 10 and the n-type current blocking layer 11 are continuously grown by MOCVD in this order through the mask film 21. In this process, the growth conditions for the n-type optical confinement layer 10 are set so that deposition of material of the optical confinement layer 10 on the mask film 21 is suppressed, but the material discretely forms like dots on the mask film 21.

Subsequently, the mask layer 21 is removed by wet etching using hydrofluoric acid system etchant and then the p-type contact layer 12 is formed by MOCVD. Then the p-side ohmic electrode 13 and the n-side ohmic electrode 14 are formed and thus the semiconductor laser device shown in FIG. 1 is completed.

The layers 2 to 12 may be formed by another vapor-phase growth such as molecular beam epitaxy (MBE).

In this manufacturing method, since the n-type GaAs current blocking layer 11 is formed on the mask film 21 where undesired material discretely exists like dots, the GaAs layer somewhat crystal-grows on the mask film 21 with the dotted material as cores. When the n-type GaAs current blocking layer 11 has a small thickness of 0.4 μm or less, however, the GaAs layer formed on the mask film 21 does not reach half of the area on the mask film 21. As a result, when removing the mask film 21 by wet etching, the etching solution sufficiently spreads over the entire mask film 21 and the mask film 21 is easily removed.

On the other hand, when the thickness of the n-type current blocking layer 11 is 0.5 μm or larger, the GaAs layer is formed in a large area far exceeding half of the mask film 21 and then it is difficult to completely remove the mask film 21. As a result, part of the mask film 21 is left to deteriorate characteristics of the finished semiconductor laser device.

Similar results were obtained when dry etching using reactive gas was performed instead of the wet etching.

Although it is not clear why the area of the GaAs layer formed on the mask film 21 is extremely reduced when the n-type current blocking layer 11 has a thickness of 0.4 μm or less, it is thought that the formation of the GaAs layer on the mask film 21 formed of $SiO_2$, which usually does not take place on a $SiO_2$ film, requires that the GaAs layer has a thickness of 0.5 μm or greater to increase adhesion strength, in addition to existence of cores. Accordingly, it is considered that the GaAs layer cannot sufficiently grow in the extending direction on the mask film 21 when the n-type current blocking layer 11 has a thickness of not more than 0.4 μm, even if cores exist on the mask film 21. This phenomenon is also observed with a mask film composed of dielectric material such as SiN, instead of $SiO_2$.

Although the embodiment has mainly described a semiconductor laser device having an active layer of strain-compensation type quantum well structure, the present invention is also applicable to semiconductor laser devices having an active layer with tensile strain, an active layer with compressive strain, an active layer without strain or an active layer of bulk structure. In the embodiment above, optical guiding layers are provided to the active layer to facilitate optical confinement in the quantum well layer, but the optical guiding layers may be omitted.

Furthermore, an n-type GaAs buffer layer may be used in place of the n-type $Ga_{0.5}In_{0.5}P$ buffer layer 2 provided between the n-type GaAs semiconductor substrate 1 and the n-type cladding layer 3, or a buffer layer is not necessarily required.

Figure 8:
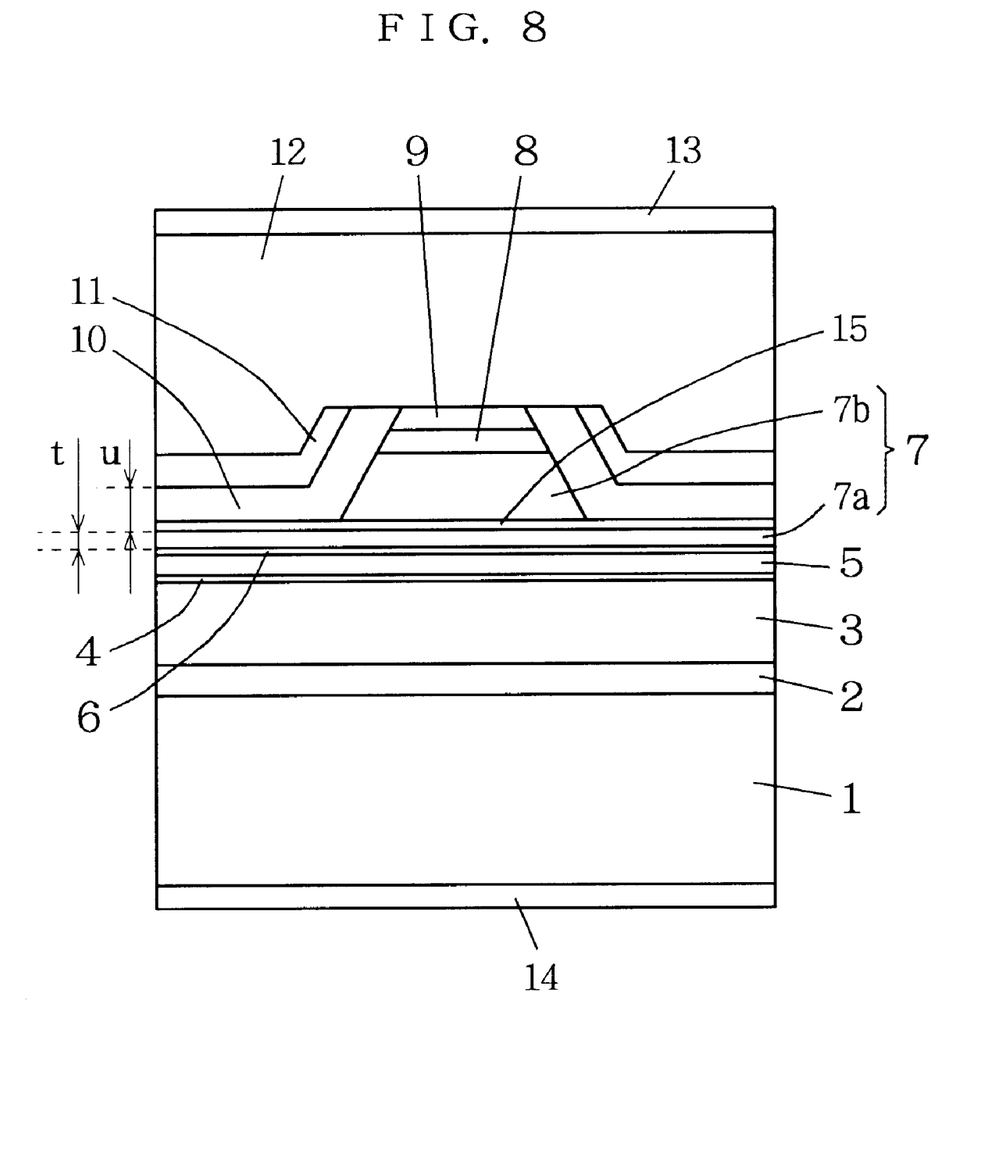
FIG. 8 is a schematic cross-sectional view of a semiconductor laser device according to another embodiment of the present invention.

As shown in FIG. 8, an etching stopping layer 15 may be provided between the flat portion 7a and the ridge portion 7b of the cladding layer 7. Furthermore, another layer such as a saturable light absorption layer may be provided in the flat portion 7a or the ridge portion 7b of the cladding layer 7.

While $(Al_xGa_{1-x})_vIn_{1-v}P$ (x>0) crystal is accurately lattice-matched to the GaAs semiconductor substrate when v=0.51 to form no strain, it causes almost no strain when the composition ratio v is in the vicinity of 0.51. Accordingly, $(Al_xGa_{1-x})_{0.5}In_{0.5}P$ in the description above indicates that the composition ratio v is in the vicinity of 0.51. Particularly, in the present invention, it is preferred that the cladding layers and the blocking layer have almost no strain.

Moreover, while the one main surface (crystal growth surface) of the GaAs semiconductor substrate 1 is inclined from (100) plane toward the [011] direction in the embodiment above, it is preferred that the one main surface of the GaAs semiconductor substrate 1 have the equivalent relation to this. That is to say, the one main surface (crystal growth surface) of the GaAs semiconductor substrate may be a surface inclined from (100) plane toward the [0$\bar{1}\bar{1}$] direction, a surface inclined from (010) plane toward the [101] or [$\bar{1}$0$\bar{1}$] direction, or a surface inclined from (001) plane toward the [110] or [$\bar{1}\bar{1}$0] direction. That is, it can be a surface inclined from {100} plane toward the <011> direction.

In addition, while the impurity concentration of the optical confinement layer 10 is equal to or less than $5 \times 10^{17} cm^{-3}$ over the entirety in the thickness direction in the embodiment, it is possible to use an optical confinement layer having impurity concentration of $5 \times 10^{17} cm^{-3}$ or less at least in the region on the side of the active layer 5 in the thickness direction. The impurity concentration in the optical confinement layer may vary gradually or in steps, or the optical confinement layer may be composed of a plurality of layers having different composition ratios.

The embodiment above has explained the AlGaInP semiconductor laser device, but the present invention is also applicable to semiconductor laser devices of other material systems, such as AlGaAs semiconductor laser devices, for example.

While the invention has been described in detail, the foregoing description is in all aspects illustrative and not restrictive. It is understood that numerous other modifications and variations can be devised without departing from the scope of the invention.

We claim:

1. A semiconductor laser device comprising, in this order:

a cladding layer of a first conductivity type;

an active layer;

a cladding layer of a second conductivity type opposite that of said first conductivity type; and a low resistivity layer doped with an impurity of the first conductivity type, having a striped opening with a specific width and having a smaller refractive index than that of said second conductivity type cladding layer and a bandgap energy greater than energy of lasing light, wherein said low resistivity layer has an impurity concentration of $5 \times 10^{17} cm^{-3}$ or less at least in the region on said active layer side in the thickness direction, wherein said second conductivity type cladding layer includes a flat portion formed on said active layer and a striped ridge portion formed on said flat portion, said flat portion having a thickness of at least 0.01 μm and not greater than 0.13 μm, and wherein said low resistivity layer is formed on the upper surface of said flat portion and side surfaces of said ridge portion, said semiconductor laser device further comprising a current blocking layer of the first conductivity type formed on said low resistivity layer and having a greater thermal conductivity than said low resistivity layer, wherein said current blocking layer includes GaAs, and wherein said low resistivity layer has a thickness of not less than 0.3 μm and not greater than 1 μm.

2. A semiconductor laser device comprising, in this order:

a cladding layer of a first conductivity type;

an active layer;

a cladding layer of a second conductivity type opposite that of said first conductivity type;

a low resistivity layer doped with an impurity of the first conductivity type, having a striped opening with a specific width and having a smaller refractive index than that of said second conductivity type cladding layer and a bandgap energy greater than energy of lasing light, and a current blocking layer of the first conductivity type formed on said low resistivity layer and having a greater thermal conductivity than said low resistivity layer, wherein said low resistivity layer has an impurity concentration of $5 \times 10^7 cm^{-3}$ or less at least in the region on said active layer side in the thickness direction, and wherein said low resistivity layer has a thickness of at least 0.3 μm and not greater than 1 μm.

3. The semiconductor laser device according to claim 2, wherein said current blocking layer includes GaAs.

4. A semiconductor laser device comprising, in this order:

a cladding layer of a first conductivity type;

an active layer;

a cladding layer of a second conductivity type opposite that of said first conductivity type;

a low resistivity layer doped with an impurity of the first conductivity type, having a striped opening with a specific width and having a smaller refractive index than that of said second conductivity type cladding layer and a bandgap energy greater than energy of lasing light, and a current blocking layer of the first conductivity type formed on said low resistivity layer and having an impurity concentration greater than said low resistivity layer, wherein said low resistivity layer has an impurity concentration of $5 \times 10^{17} cm^{-3}$ or less at least in the region on said active layer side in the thickness direction, and wherein said low resistivity layer has a thickness of at least 0.3 µm and not greater than 1 µm.

5. The semiconductor laser device according to claim 4, wherein said current blocking layer includes GaAs.

6. A semiconductor laser device comprising, in this order:

a cladding layer of a first conductivity type;

an active layer;

a cladding layer of a second conductivity type opposite that of said first conductivity type; and a low resistivity layer doped with an impurity of the first conductivity type, having a striped opening with a specific width and having a smaller refractive index than that of said second conductivity type cladding layer and a bandgap energy greater than energy of lasing light, wherein said low resistivity layer has an impurity concentration of $5 \times 10^{17} cm^{-3}$ or less at least in the region on said active layer side in the thickness direction, wherein said low resistivity layer has a thickness of at least 0.3 µm and not greater than 1 µm, wherein said second conductivity type cladding layer includes a flat portion formed on said active layer and a striped ridge portion formed on said flat portion, wherein said low resistivity layer is formed on the upper surface of said flat portion and side surfaces of said ridge portion, and wherein said semiconductor laser device further comprising an etching stopping layer provided on said flat portion and between said flat portion and said ridge portion.

7. The semiconductor laser device according to claim 6, wherein said low resistivity layer has a carrier concentration of approximately $5 \times 10^6 cm^{-3}$ or greater at least in the region on said active layer side in the thickness direction.

8. The semiconductor laser device according to claim 6, wherein said low resistivity layer has a carrier concentration of approximately $5 \times 10^{16} cm^{-3}$ or greater in the entire region in the thickness direction.

\* \* \* \* \*